United States Patent [19]

Tamura et al.

[11] Patent Number: 4,687,938
[45] Date of Patent: Aug. 18, 1987

[54] ION SOURCE

[75] Inventors: Hifumi Tamura, Hachioji; Hiroyasu Shichi, Kokubunji, both of Japan

[73] Assignee: Hitachi, Ltd., Tokyo, Japan

[21] Appl. No.: 808,027

[22] Filed: Dec. 12, 1985

[30] Foreign Application Priority Data

Dec. 17, 1984 [JP] Japan .................. 59-264467

[51] Int. Cl.[4] .............................. H01J 27/00
[52] U.S. Cl. ................. 250/423 F; 250/423 R; 315/111.81; 313/362.1
[58] Field of Search ............... 250/423 R, 425, 423 F; 313/362.1; 315/111.81

[56] References Cited

U.S. PATENT DOCUMENTS 4,164,680 8/1979 Villalobos ............... 250/423 R
4,246,481 1/1981 Liebl ................... 250/423 R
4,367,429 1/1983 Wang et al. ............. 250/423 R
4,488,045 12/1984 Anazawa et al. ......... 250/423 R Primary Examiner—Bruce C. Anderson
Attorney, Agent, or Firm—Antonelli, Terry & Wands

[57] ABSTRACT

An ion source includes an ion source material holder adapted to load an ion source material thereon and having an aperture at the bottom thereof, an ion emitter mounted on the ion source material holder at the aperture, heating means for heating the ion source material holder and the ion emitter, and an ion extracting electrode for extracting an ion beam from the ion emitter. The ion emitter is made of a mixture of a material having a large work function and a material having a small work function, in order to be able to emit both positive ions and negative ions from the ion emitter. The polarity of a voltage applied between the ion emitter and the ion extracting electrode is changed so that one of the positive ion beam and the negative ion beam can be selectively extracted from the ion emitter.

7 Claims, 2 Drawing Figures

ION SOURCE

BACKGROUND OF THE INVENTION

The present invention relates to an ion source, and more particularly to an ion source capable of generating both a positive ion beam and a negative ion beam.

An ion source for generating an ion beam, which is used for forming a semiconductor body and other substrates, and can be used in a secondary ion mass spectrometer, an ion scattering spectrometer and others.

Conventionally, a liquid metal ion source such as described in a Japanese patent application specification (examined publication No. Sho 58-33649) and a surface ionization type ion source have been known. The operation principle of the liquid metal ion source is as follows. An ion source material for generating a desired ion species is supplied to the tip of a needle-like ion emitter chip in the molten state. Then, a strong electric field is formed between the ion emitter chip and an ion extracting electrode, and thus a sharp cone is made of the molten ion source material at the tip of the emitter chip so that the surface tension of the molten ion source material balances with the stress due to the electric field. In this state, an ion beam is emitted from the tip of the cone by the field evaporation mechanism.

The liquid metal ion source has the following drawbacks. (1) It is difficult to take out an ion from a sublimate material. (2) The initial energy of emitted ions is as high as 5 to 50 eV. (3) It is difficult to take out negative ion species from this type of ion source. (4) It is difficult to obtain an ion beam from a component element of a gas. (5) The angular distribution of ion emission is small, and it is basically impossible to obtain a high-intensity ion beam.

While, in a surface ionization type ion source, an ion emitter is made of one of mono-atomic metals having a large work function such as W and Ir, only ions of elements having a low ionization potential such as Cs and Li can be emitted from the ion emitter. That is, the surface ionization type ion surface has a drawback that only the ion of an electropositive element can be emitted. Regarding the general knowledge of the ion source, U.S. Pat. application Ser. No. 578,206 is hereby incorporated by reference.

SUMMARY OF THE INVENTION

In view of the above-mentioned drawbacks of the prior art, an object of the present invention is to provide a long-lived ion source which can generate both a positive ion beam and a negative ion beam stably. In a conventional surface ionization type ion source for generating both a positive ion beam and a negative ion beam independently of each other, it is necessary that an ion emitter for emitting a positive ion beam and an ion emitter for emitting a negative ion beam are made of a material having a large work function and a material having a small work function, respectively. That is, the two ion emitters are greatly different (rather of opposite nature) from each other in work function. According to the present invention, a material having a large work function and a material having a small work function are mixed, and then sintered. The mixture thus obtained is used for forming an ion emitter. That is, an ion emitter according to the present invention is formed of particles having a large work function and particles having a small work function, and emits positive and negative ion beams capable of improving the processing speed or analytical sensitivity in the processing or analysis of a sample with an ion beam.

Next, the basic principle of the present invention will be explained below. The ionization phenomenon due to the surface ionization mechanism takes place in the following manner. When an atom of an ion source material is ejected by evaporation from the surface of a metal which is heated to a high temperature, in the form of the neutral atom, an electron is taken out from or attached to the ejected atom by the quantum mechanical tunnel effect, and thus a positive or negative ion is formed. In more detail, the positive ion emission takes place in such a manner that when an ion source material having a low ionization potential is absorbed by and desorbed from the surface of a metal which has a large work function and is heated to a high temperature, an electron is taken out of an ejected particle and is transferred to the surface of the metal. While, a negative ion emission takes place in such a manner that when an atom having high electron affinity is absorbed by and desorbed from the surface of a metal which has a small work function and is heated to a high temperature, an electron is supplied from the surface of the metal to the atom.

In view of the above ionization mechanism, the fundamental concept of the present invention resides in that an ion emitter is made of a mixture of a material having a large work function and a material having a small work function, a positive ion is taken out of a material which has a low ionization potential and is located on an ion emitter, area of high work function, a negative ion is taken out of a material which has high electron affinity and is located on an ion emitter, area of low work function, and thus both a positive ion beam and a negative ion beam can be emitted from the same ion emitter.

DESCRIPTION OF THE PREFERRED EMBODIMENT

An embodiment of an ion source according to the present invention will be explained below, by reference to the drawings.

Figure 1:
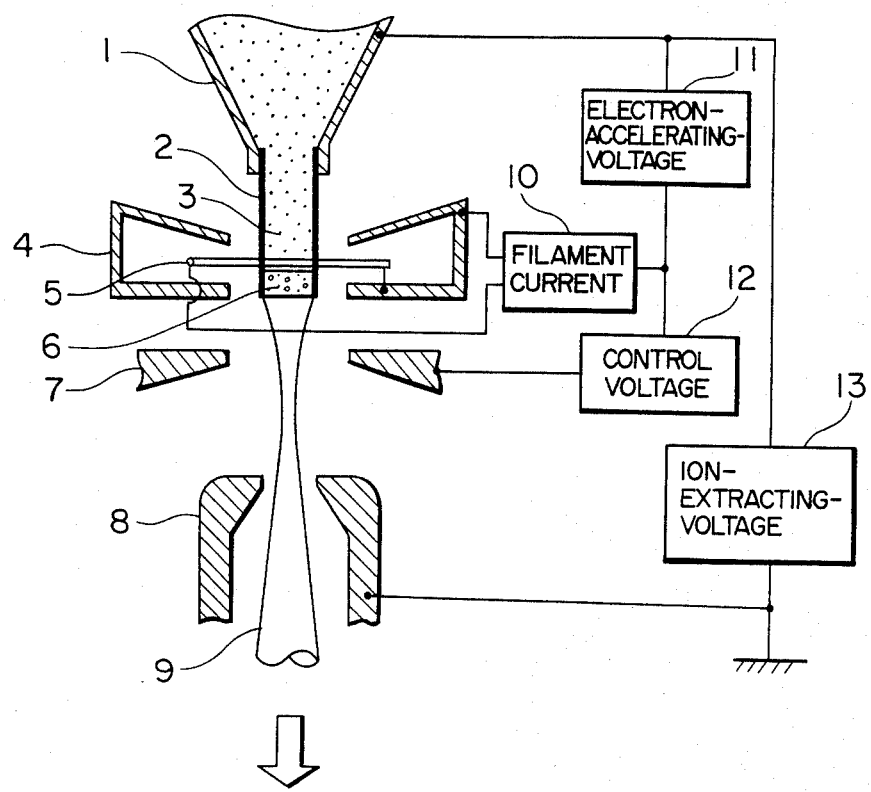
FIG. 1 is a view, partly in cross section and partly in block, of an embodiment of an ion source according to the present invention.
Figure 2:
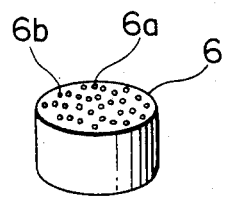
FIG. 2 is a perspective view showing the ion emitter of FIG. 1.

Referring to FIG. 1, the embodiment includes an ion source material reservoir 1, a sleeve 2, an ion emitter 6 mounted on one end of the sleeve 2 and made of a mixture of a material having a large work function and a material having a small work function in accordance with the present invention, a filament 5 for emitting an electron beam which is used for heating an ion source material 3 and the ion emitter 6, a Wehnelt electrode 4 for controlling the electron beam emitted from the filament 5, a control electrode 7 for controlling an ion beam 9, an ion extracting electrode 8, a current source 10 for supplying a current to the filament 5, a voltage source 11 for generating an electron accelerating voltage, a voltage source 12 for applying a voltage between the control electrode 7 and the Wehnelt electrode 4, and a voltage source 13 for applying a voltage between the ion emitter 6 and the ion extracting electrode 8. In forming the ion emitter 6, tungsten particles having a work function of 5.4 eV and diameters in a range from 5 to 100 μm are used as the material with a large work function, and lanthanum hexaboride (LaB$_6$) particles having a work function of 2.60 eV and diameters in a range from 5 to 100 μm are used as the material with a small work function. Referring to FIG. 2, the tungsten particles 6a and the lanthanum hexaboride particles 6b are mixed so that the mixture contains tungsten and lanthanum in an atomic ratio of 1:1, and the mixture thus obtained is pressed into a predetermined shape. Then, the mixture is sintered to form the ion emitter 6. The sintered ion emitter 6 has a porosity of 5 to 30%. The voltage source 13 includes polarity changing means for keeping the ion extracting electrode 8 at a positive or negative potential with respect to the ion emitter 6. The atomic ratio mentioned above can be varied arbitrarily according to the desired performance.

The operation principle of the present embodiment is as follows. First, a positive ion emission will be explained. In the present embodiment, not only chemical compounds such as CsCl, NaCl and CsI but also metals having high vapor pressures such as Zn, Al and Cr can be used as an ion source material. A case where CsCl is used as the ion source material will be explained below, by way of example.

Referring to FIG. 1, the ion source material 3 (namely, CsCl) is loaded in the reservoir 1 and the sleeve 2, and then a chamber including the members 1 to 8 is evacuated. Thereafter, a current is caused to flow through the filament 5. Thus, the filament is heated and put into a state capable of emitting electrons. Then, an electron accelerating voltage is applied between the ion emitter 6 and each of the filament 5 and the Wehnelt electrode 4, to heat the ion emitter 6, the sleeve 2 and the ion source material 3, by electron bombardment. Thus, the ion source material 3 is melted or vaporized, to be supplied to the surace of the ion emitter 6. The ion source material supplied to the surface of the ion emitter 6 is emitted in the form of ions by the surface ionization mechanism. The emitted ion is taken out in the form of the ion beam 9, by an electric field formed by the ion extracting electrode 8 and the control electrode 7.

Cs$^+$-ions and Cl$^-$-ions can be extracted from the ion source material CsCl by the following mechanism. Let us consider a case where a Cs-atom is evaporated from the surface of the tungsten particle having a large work function. In this case, a difference between the ionization potential of the Cs-atom and the work function of tungsten, acts as a potential barrier at the interface between the Cs-atom and the tungsten particle, and an electron is transferred from the Cs-atom to the tungsten particle by the so-called tunnel effect. Thus, the Cs$^+$-ion is formed. While, in a case where a Cl-atom having high electron affinity is evaporated from the surface of the LaB$_6$ particle having a small work function, an electron is supplied from the LaB$_6$ particle to the Cl-atom, and thus the Cl$^-$-ion is formed.

The inventors confirmed that when the ion emitter 6 was at a positive potential with respect to the ion extracting electrode 8, a Cs$^+$-ion beam was emitted from the ion emitter 6, and when the ion emitter 6 was at a negative potential with respect to the ion extracting electrode 8, a Cl$^-$-ion beam was emitted. Further, each of the Cs$^+$-ion beam and the Cl$^-$-ion beam showed an ion current of several milliamperes, and thus the present embodiment was put to a practical use.

Next, brief explanation will be made on a case where an ion source according to the present invention is applied to the secondary ion mass spectrometry.

In the secondary ion mass spectrometry, when the positive ion of a positive element is used as a primary ion and the negative ion of a negative element is detected as a secondary ion, the ionization efficiency of the negative element is increased by two or four orders of magnitude in accordance with the species of element. Further, when the negative ion of a negative element is used as a primary ion and the positive ion of a positive element is detected as a secondary ion, the ionization efficiency of the positive element is increased by two or four orders of magnitude in accordance with the species of element. In order to attain the above high sensitivity, a conventional secondary ion mass spectrometer is provided with a Cs ion source and an O$_2$ (or Ar) ion source which are independent of each other, thereby selecting one of these ion sources in accordance with the object of analysis.

According to the present invention, a chemical compound of a positive element with a negative element such as CsCl or CsI is used as an ion source material, and a positive ion beam due to a positive element or a negative ion beam due to a negative element can be taken out only by inverting the polarity of the voltage applied between the ion emitter 6 and the ion extracting electrode 8. That is, an ion source according to the present invention which is used as primary ion generating means, speeds up an analytical operation performed by a secondary ion mass spectrometer, and moreover reduces the manufacturing cost thereof. Furthermore, an ion source according to the present invention emits an extremely pure ion beam by the above-mentioned ion emission mechanism. Accordingly, when the ion source is used as the primary ion generating means in a secondary ion mass spectrometer, it is not necessary to purify the primary ion.

As has been explained in the foregoing, according to the present invention, an ion emitter is made of a mixture of a material having a large work function and a material having a small work function, and one of a positive ion beam and a negative ion beam is taken out from the ion emitter by changing the polarity of a voltage applied between the ion emitter and an ion extracting electrode. Thus, the positive or negative ion beam can be readily and selectively taken out.

We claim:

1. An ion source including ion source material holding means adapted to load an ion source material therein and having an aperture at the bottom thereof, an ion emitter mounted on said ion source material holding means at said aperture, heating means for heating said ion source material holding means and said ion emitter, an ion extracting electrode for forming a strong electric field on the surface of said ion emitter, thereby extracting an ion beam from said ion emitter, and polarity changing means for changing the polarity of an ion extracting voltage applied between said ion emitter and said ion extracting electrode, wherein said ion emitter is made of a mixture of a material having a large work function for extracting positive ions upon application of said extracting voltage having a first polarity and a material having a small work function for extracting negative ions upon application of said extracting voltage having a second polarity.

2. An ion source according to claim 1, wherein said ion emitter is formed by sintering a mixture of a material having a large work function and a material having a small work function.

3. An ion source according to claim 2, wherein tungsten is used as the material having a large work function, and lanthanum hexaboride is used as the material having a small work function.

4. An ion source according to claim 3, wherein said ion emitter is formed by sintering a mixture of tungsten and lanthanum hexaboride, and has a porosity of 5 to 30%.

5. An ion source according to claim 1, wherein said ion emitter is porous.

6. An ion source according to claim 1, wherein said ion source material is CsCl.

7. An ion source according to claim 1, wherein said ion source material is CsI.

* * * * *